(12) United States Patent
Baek et al.

(10) Patent No.: US 9,870,900 B2
(45) Date of Patent: Jan. 16, 2018

(54) METHODS AND SYSTEMS FOR MANAGING SEMICONDUCTOR MANUFACTURING EQUIPMENT

(71) Applicant: Samsung Electronics Co., Ltd., Suwon-si (KR)

(72) Inventors: Kye Hyun Baek, Suwon-si (KR); Ohyung Kwon, Seongnam-si (KR); Junghyun Cho, Suwon-si (KR); Haejoong Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 387 days.

(21) Appl. No.: 14/631,083

(22) Filed: Feb. 25, 2015

(65) Prior Publication Data

US 2016/0035545 A1 Feb. 4, 2016

(30) Foreign Application Priority Data

Jul. 30, 2014 (KR) .................. 10-2014-0097536

(51) Int. Cl.
*H01J 37/32* (2006.01)
(52) U.S. Cl.
CPC .... *H01J 37/32917* (2013.01); *H01J 37/3288* (2013.01); *H01J 37/32807* (2013.01)
(58) Field of Classification Search
CPC ............. H01J 37/32807; H01J 37/3288; H01J 37/32917; H01L 21/02041; H01L 21/02043; H01L 21/02096
USPC ............................................ 702/64, 75, 159
See application file for complete search history.

(56) References Cited

U.S. PATENT DOCUMENTS

| | | | |
|---|---|---|---|
| 3,778,616 A * | 12/1973 | Ranniger | H04B 10/1127 356/138 |
| 6,189,121 B1 | 2/2001 | Ogawa | |
| 6,781,317 B1 | 8/2004 | Goodman | |
| 6,853,953 B2 | 2/2005 | Brcka et al. | |
| 6,873,114 B2 | 3/2005 | Avoyan et al. | |
| 6,919,689 B2 | 7/2005 | Jafarian-Tehrani et al. | |
| 6,985,787 B2 | 1/2006 | Klekotka | |
| 7,020,583 B2 | 3/2006 | Calabrese et al. | |
| 7,084,832 B2 | 8/2006 | Pribyl | |
| 7,829,468 B2 | 11/2010 | Keil et al. | |
| 2004/0103914 A1* | 6/2004 | Cheng | B08B 7/0035 134/1.1 |
| 2007/0076135 A1* | 4/2007 | Gomyou | G02F 1/135 349/25 |
| 2007/0262723 A1 | 11/2007 | Ikenouchi | |
| 2011/0022215 A1 | 1/2011 | Keil | |
| 2012/0098545 A1 | 4/2012 | Son et al. | |

(Continued)

FOREIGN PATENT DOCUMENTS

| | | | |
|---|---|---|---|
| JP | 4297659 B2 | 4/2009 | |
| JP | 5128571 B2 | 11/2012 | |
| KR | 2012-0041427 A | 5/2012 | |

*Primary Examiner* — Jarrett Stark
*Assistant Examiner* — Shahed Ahmed
(74) *Attorney, Agent, or Firm* — Myers Bigel, P.A.

(57) ABSTRACT

Provided are methods and systems for managing semiconductor manufacturing equipment. A method may include preventive maintenance involving steps of disassembling, cleaning, and assembling parts of a chamber. The assembling of the parts may include checking whether the parts are correctly assembled, using reflectance and absorptivity of a high-frequency voltage applied to the parts.

15 Claims, 20 Drawing Sheets

(56) References Cited

U.S. PATENT DOCUMENTS

2012/0101622 A1    4/2012  Yun et al.
2016/0334552 A1*  11/2016  Lenef ................... G02B 5/0858

* cited by examiner

METHODS AND SYSTEMS FOR MANAGING SEMICONDUCTOR MANUFACTURING EQUIPMENT

CROSS-REFERENCE TO RELATED APPLICATION

This U.S. non-provisional patent application claims priority under 35 U.S.C. §119 to Korean Patent Application No. 10-2014-0097536, filed Jul. 30, 2014, the entire contents of which are hereby incorporated herein by reference.

FIELD

Example embodiments of the inventive concept relate to methods and systems of managing semiconductor manufacturing equipment.

BACKGROUND

In general, semiconductor devices may be manufactured using a plurality of unit processes, such as a thin-film deposition process, a photolithography process, an etching process, an ion implantation process, and a cleaning process. The thin-film deposition process and the etching process are usually performed using a plasma step, in which positive charges are produced from a source gas. However, when the charged source gas is supplied into a chamber provided with a substrate, the charged source gas may lead to contamination of an inner surface and parts of the chamber. Accordingly, a preventive maintenance (PM) step is periodically performed to manage the parts.

SUMMARY

Example embodiments of the inventive concept provide semiconductor manufacturing management methods and systems, allowing an operator to check in real time whether there is a parts-assembling failure, when a preventive maintenance step is performed.

According to example embodiments of the inventive concept, a method of managing semiconductor manufacturing equipment may include preventive maintenance including steps of disassembling, cleaning, assembling parts of a chamber. The assembling of the parts may include checking whether the parts are normally (i.e., properly or correctly) assembled, using reflectance and absorptivity of a high-frequency voltage applied to the parts.

In example embodiments, the method may further include obtaining a reference reflectance and a reference absorptivity of the parts, before the preventive maintenance. The checking may include obtaining a real reflectance and a real absorptivity from the high-frequency voltage applied to the parts, and comparing the real reflectance and the real absorptivity with the reference reflectance and the reference absorptivity, respectively, to check whether the assembling of the parts has been performed correctly.

In example embodiments, the obtaining of the real reflectance and the real absorptivity may include applying first and second input high-frequency voltages to the parts to obtain first and second output high-frequency voltages, and calculating the real reflectance and the real absorptivity from the first and second output high-frequency voltages and the first and second input high-frequency voltages.

In example embodiments, each of the real reflectance and the reference reflectance may have a resonance frequency and a resonance intensity obtained from the first and second input high-frequency voltages and the first and second output high-frequency voltages, and the resonance frequency decreases as the assembling of the parts progresses.

In example embodiments, if the resonance frequency of the reference reflectance is coincident with that of the real reflectance, the assembling of the parts may be determined to have been performed correctly.

In example embodiments, if the resonance frequency of the reference reflectance is different from that of the real reflectance, the assembling of the parts may be determined to be abnormally (i.e., incorrectly) performed. Further, the resonance frequency and the resonance intensity may be calculated using a vector.

In example embodiments, total inductance and capacitance of the parts may increase as the assembling of the parts progresses.

In example embodiments, the reference reflectance and the reference absorptivity correspond to reference scattering variables obtained from the parts that are normally assembled. The method may further include calculating a reference scattering matrix including the reference scattering variables.

In example embodiments, the real reflectance and the real absorptivity may correspond to real scattering variables, and the checking further may include calculating a real scattering matrix including the real reflectance and the real absorptivity.

In example embodiments, the comparing the real reflectance and the real absorptivity with the reference reflectance and the reference absorptivity may include comparing the real scattering matrix with the reference scattering matrix.

In example embodiments, the disassembling of the parts may include obtaining a reference scattering matrix. The checking may include obtaining a real scattering matrix whenever the assembling of the parts is performed and comparing the real scattering matrix with the reference scattering matrix to check whether the parts are normally assembled.

In example embodiments, the method may further include performing a seasoning process on the chamber, and performing a manufacturing process including a run step and an idle step. The run step may include generating plasma in the chamber, and the idle step may be performed without generating plasma in the chamber.

According to example embodiments of the inventive concept, provided is a system for managing semiconductor manufacturing equipment, in which a chamber including parts may be provided. The system may include a high-frequency voltage meter, which is configured to apply an input high-frequency voltage to the parts and measure an output high-frequency voltage from the parts, and a control unit, which is configured to obtain reflectance and absorptivity from the input and output high-frequency voltages and determine whether the parts are assembled correctly in a preventive maintenance step for the parts, using the reflectance and the absorptivity.

In example embodiments, the parts may include a lower part provided at a lower portion of the chamber, and an upper part provided at an upper portion of the chamber to face the lower part. The high-frequency voltage meter may include a first lead connected to the lower part, and a second lead connected to the upper part.

In example embodiments, the system may further include a generator disposed outside the chamber and configured to generate a high-frequency power, which will be applied to the upper part to induce a plasma reaction in the chamber. The system may further include a matcher configured to achieve an impedance matching between the generator and the upper part. The upper part may include internal and outer electrodes connected to the generator, and the lower part includes an electrostatic chuck which is connected to a ground voltage. The first lead may be connected to the electrostatic chuck, and the second lead may be connected to at least one of the internal and outer electrodes.

According to example embodiments of the inventive concept, a method of managing semiconductor manufacturing equipment may include obtaining reference reflectance and absorptivity from first to N-th parts, starting a preventive maintenance for cleaning the first to N-th parts; and checking whether each of the first to N-th parts is assembled correctly, whenever each of the first to N-th parts is assembled in the preventive maintenance.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
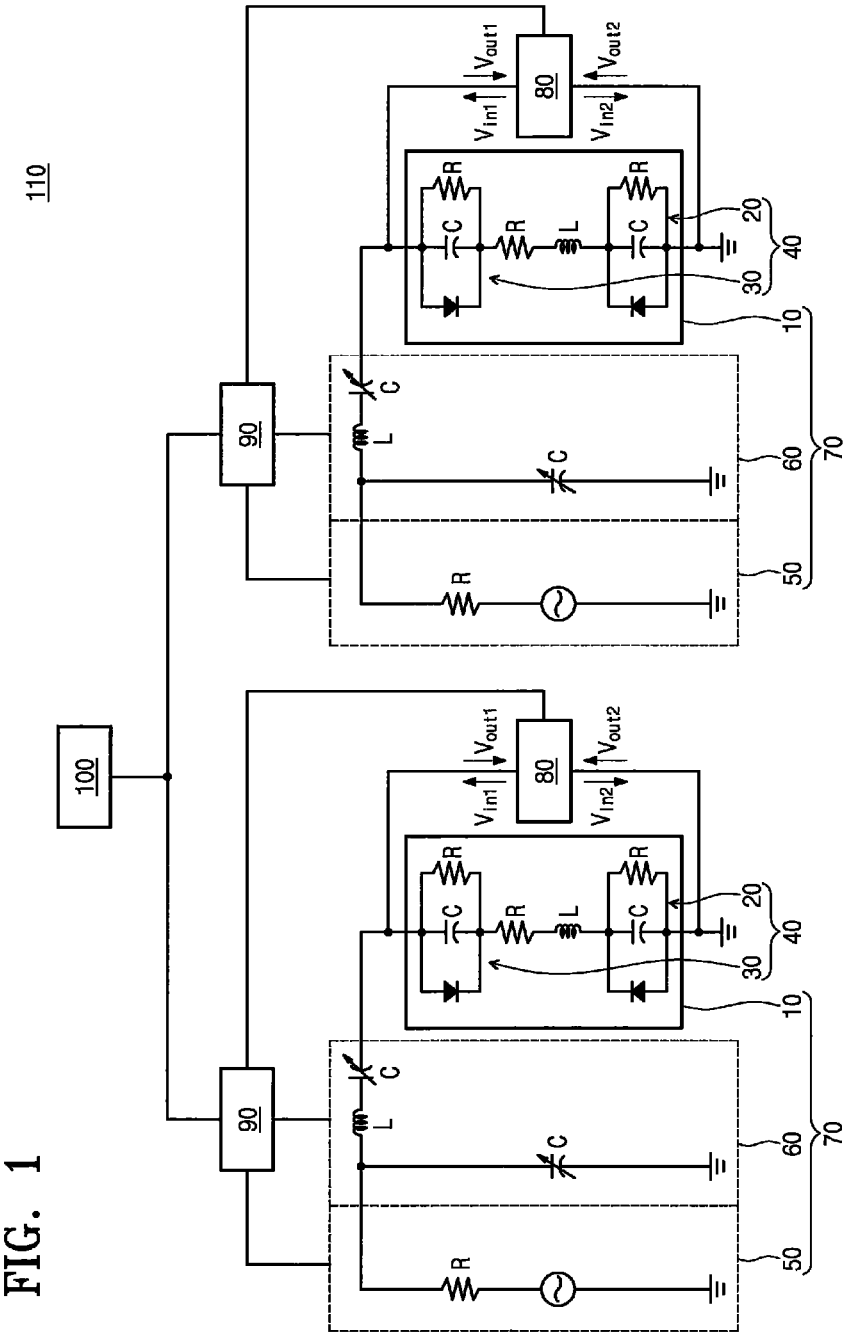
FIG. 1 is a circuit diagram illustrating an example of semiconductor-manufacturing management systems according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram illustrating an example of semiconductor-manufacturing management systems 110 according to example embodiments of the inventive concept.

Referring to FIG. 1, the management system 110 may include semiconductor manufacturing equipment 70, high-frequency voltage meters 80, control units 90, and a server 100.

The semiconductor manufacturing equipment 70 may be configured to perform a process for manufacturing a semiconductor device using a plasma reaction. For example, each semiconductor manufacturing equipment 70 may be configured to perform at least one of etching, deposition, and/or ashing processes. In example embodiments, each semiconductor manufacturing equipment 70 may include at least one chamber 10, a plurality of parts 40, at least one generator 50, and at least one matcher 60.

The chamber 10 may be configured to provide an internal space isolated from the outside. An internal pressure of the chamber 10 may be decreased below the normal pressure (for example, to a vacuum pressure). Although not shown, the chamber 10 may be connected to a reaction gas supplying part and a vacuum pump. In example embodiments, the chamber 10 may include a plurality of the parts 40. The parts 40 may be configured to realize the vacuum pressure in the chamber 10 and induce a plasma reaction in the chambers 10 using a high-frequency power. The parts 40 may include a lower part 20 and an upper part 30. For example, the lower and upper parts 20 and 30 may be electric parts, to which high-frequency power is applied. The lower part 20 may be provided at a lower portion of the chamber 10. In certain embodiments, the lower part 20 may be connected to a ground voltage. The upper part 30 may be provided at an upper portion of the chamber 10. In the case where high-frequency power is applied to the upper part 30, each of the lower and upper parts 20 and 30 may serve as a capacitor and a resistor. In addition, the lower and upper parts 20 and 30 may be electrically coupled with resistance R, capacitance C, and inductance L.

Figure 2:
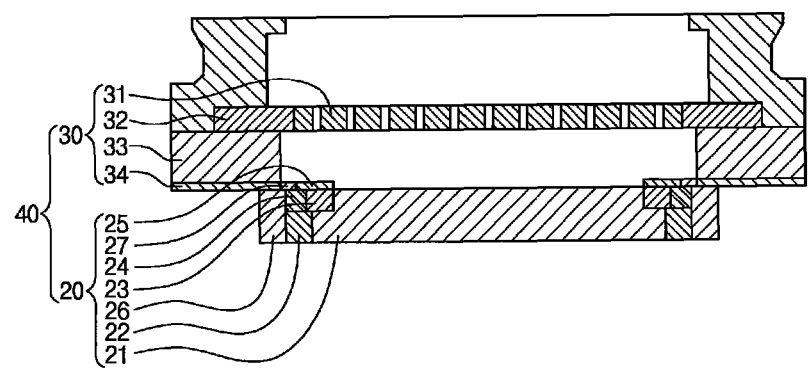
FIG. 2 is a sectional view illustrating some of the parts of FIG. 1.

FIG. 2 is a sectional view illustrating the parts shown in FIG. 1. Referring to FIG. 2, the lower part 20 may include first to seventh parts 21-27. For example, the first to seventh parts 21-27 may be used as or include an electrostatic chuck 21, a focus ring 22, a ceramic coupling ring 23, a quartz clamp ring 24, a cooled edge ring 25, an aluminum ground ring 26, and an edge cover ring 27, respectively. The electrostatic chuck 21 may include a lower electrode (not shown) connected to a ground voltage. The first part 21 may be disposed at a center of a lower portion of the chamber 10. High-frequency power may be applied to the first part 21 to generate plasma on the first part 21. Alternatively, the first part 21 may be configured to hold a substrate (not shown). The second part 22 may be disposed around the first part 21. The second part 22 may be configured to confine the plasma in a specific space (e.g., on the first part 21 or the substrate) of the chamber 10. The third part 23 may be disposed on the second part 22. The fourth part 24 may fasten the second part 22 and the third part 23. The fifth part 25 may be disposed on the third part 23 and an edge of the first part 21. The sixth part 26 may be disposed on an edge of the third part 23 and around the fifth part 25. The seventh part 27 may be disposed on the fifth part 25 and the sixth part 26. In a preventive maintenance (PM) step, the lower part 20 may be disassembled in order from the seventh part 27 to the first part 21. In other words, the first to seventh parts 21-27 may be disassembled in reverse order. Further, in the PM step, the first to seventh parts 21-27 may be assembled in the order enumerated.

The upper part 30 may include eighth to eleventh parts 31-34. For example, the eighth to eleventh parts 31-34 may be used as or include an inner electrode 31, an outer electrode 32, a C-shroud ring 33, and a pressure control ring 34, respectively. The eighth part 31 may be disposed at a center of an upper portion of the chamber 10. The ninth part 32 may be disposed around the eighth part 31. High-frequency power may be provided to the eighth part 31 and the ninth part 32. High-frequency power may be used to induce a plasma reaction. The tenth part 33 may be provided between the ninth part 32 and the seventh part 27. The tenth part 33 may be used to hermetically seal an inner space of the chamber 10. The eleventh part 34 may be provided below the tenth part 33. An internal pressure of the chamber 10 may be controlled by the eleventh part 34. Although not shown, the chamber 10 may further include at least one additional part of the lower and upper parts 20 and 30. In the PM step, the upper part 30 may be disassembled in order from the eleventh part 34 to the eighth part 31. The upper part 30 may be assembled in order from the eighth part 31 to the eleventh part 34.

Referring back to FIG. 1, each of the generators 50 may generate high-frequency power. The high-frequency power may be applied to the upper part 30. For example, each of the generators 50 may include electric power and a resistor R. The generators 50 may be configured to generate a power of about 10,000 W.

The matcher 60 may be configured to achieve an impedance matching between the electric parts 40 and the generator 50. For example, each of the matchers 60 may include at least one capacitor C and at least one inductor L. When impedances of the parts 40 and the generator 50 are matched, an output power of the high-frequency power may be maximized. The high-frequency power may be used to induce a plasma reaction in the chamber 10.

The high-frequency voltage meter 80 may be configured to measure reflectance and absorptivity of high-frequency voltage from the electric parts 40. The high-frequency voltage meter 80 may be connected to the parts 40, when the PM step is performed or plasma is not produced. The reflectance and absorptivity of the parts 40 may be measured by the high-frequency voltage meter 80, whenever the parts 40 are disassembled and/or assembled.

Figure 3:
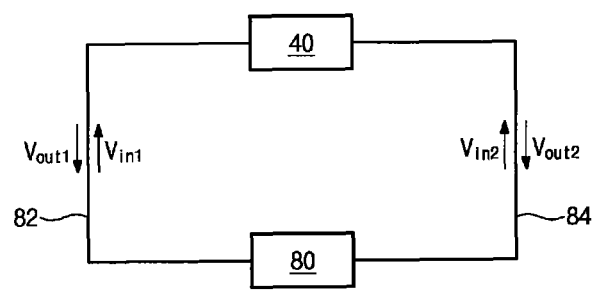
FIG. 3 is a circuit diagram exemplarily illustrating the parts and the high-frequency voltage meter shown in FIG. 1.

FIG. 3 is a circuit diagram exemplarily illustrating the parts 40 and the high-frequency voltage meter 80 of FIG. 1. The high-frequency voltage meter 80 may be connected in series to the parts 40. The high-frequency voltage meter 80 may include a first lead 82 and a second lead 84, which are respectively connected to both ends of the parts 40. For example, the first lead 82 may be connected to the first part 21. The second lead 84 may be connected to the eighth part 31 and the ninth part 32.

The high-frequency voltage meter 80 may be configured to apply a first input high-frequency voltage $V_{in1}$ to the parts 40 through the first lead 82 and measure a first output high-frequency voltage $V_{out1}$ reflected from the parts 40. A first reflectance may be given by dividing the first output high-frequency voltage $V_{out1}$ by the first input high-frequency voltage $V_{in1}$ and calculating a logarithmic value thereof. Here, the second lead 84 may be electrically grounded.

The high-frequency voltage meter 80 may also be configured to apply a second input high-frequency voltage $V_{in2}$ to the parts 40 through the second lead 84 and measure a second output high-frequency voltage $V_{out2}$ reflected from the parts 40. A second reflectance may be given by dividing the second output high-frequency voltage $V_{out2}$ by the second input high-frequency voltage $V_{in2}$ and calculating a logarithmic value thereof. Here, the first lead 82 may be electrically grounded.

The high-frequency voltage meter 80 may also be configured to apply the second input high-frequency voltage $V_{in2}$ to the second lead 84 and measure the first output high-frequency voltage $V_{out1}$ through the first lead 82. A first absorptivity may be given by dividing the first output high-frequency voltage $V_{out2}$ by the second input high-frequency voltage $V_{in2}$ and calculating a logarithmic value thereof.

The high-frequency voltage meter 80 may also be configured to apply the first input high-frequency voltage $V_{in1}$ to the first lead 82 and measure the second output high-frequency voltage $V_{out2}$ through the second lead 84. A second absorptivity may be given by dividing the second output high-frequency voltage $V_{out2}$ by the first input high-frequency voltage $V_{in1}$ and calculating a logarithmic value thereof.

Referring back to FIG. 1, the control units 90 may be configured to monitor each of the semiconductor manufacturing equipment 70, respectively. Each of the control units 90 may calculate first and second reflectances and first and second absorptivities from the first input high-frequency voltage $V_{in1}$, the first output high-frequency voltage $V_{out1}$, the second input high-frequency voltage $V_{in2}$, and the second output high-frequency voltage $V_{out2}$. In example embodiments, the first and second reflectances may include first and second reference reflectances and first and second real reflectances. The first and second reference reflectances may be obtained from the parts 40, which have been normally assembled. The first and second real reflectances may be obtained from the parts 40, which are being assembled during the PM step.

The first and second absorptivities may include first and second reference absorptivities and first and second real absorptivities. The first and second reference absorptivities may be obtained from the parts 40, which have been normally assembled (i.e., assembled correctly). The first and second real absorptivities may be obtained from the parts 40, which are being assembled during the PM step.

The control unit 90 may be configured to derive a scattering matrix given by the following equation 1.

$$S = \begin{pmatrix} S_{11} & S_{12} \\ S_{21} & S_{22} \end{pmatrix}$$ [Equation 1]

where S is a scattering matrix represented by first, second, third, and fourth scattering variables $S_{11}$, $S_{12}$, $S_{21}$, and $S_{22}$. The first to fourth scattering variables $S_{11}$, $S_{12}$, $S_{21}$, and $S_{22}$ may be given by the first reflectance, the first absorptivity, the second absorptivity, and the second reflectance.

The control unit 90 may determine whether there is an assembling failure of the parts 40 and/or a failure of each of them, using the scattering matrix. The scattering matrix S may include a reference scattering matrix and a real scattering matrix. The reference scattering matrix may be obtained from the parts 40, which have been correctly assembled. The reference scattering matrix may include the first and second reference reflectances and the first and second reference absorptivities.

The real scattering matrix may be obtained from the parts 40, which are being assembled during the PM step. The real scattering matrix may include the first and second real reflectances and the first and second real absorptivities. In example embodiments, the control unit 90 may compare the reference scattering matrix with the real scattering matrix and determine whether the parts 40 are correctly assembled. A method of comparing electric reflectivities with each other in the control unit 90 will be described in more detail with reference to a method of managing the semiconductor manufacturing equipment 70.

The server 100 may be configured to share or exchange information on the semiconductor manufacturing equipment 70 with the control units 90 through a communication protocol, such as Semi Equipment Communications Standard (SECS) protocol or a Transmission Control Protocol/Internet Protocol (TCP/IP).

Until now, the management system 110 for the semiconductor manufacturing equipment 70 has been described with reference to FIGS. 1 through 3. However, the management system 110 of FIGS. 1 through 3 is an example for providing better understanding of example embodiments of the inventive concept, and example embodiments of the inventive concept may not be limited thereto. In other words, the management system 110 may be applied, in the same or similar manner based on the inventive concept described herein, to equipment for a mass production of a semiconductor device.

A method of managing the semiconductor manufacturing equipment 70 using the management system 110 will be described below.

First Embodiments

Figure 4:
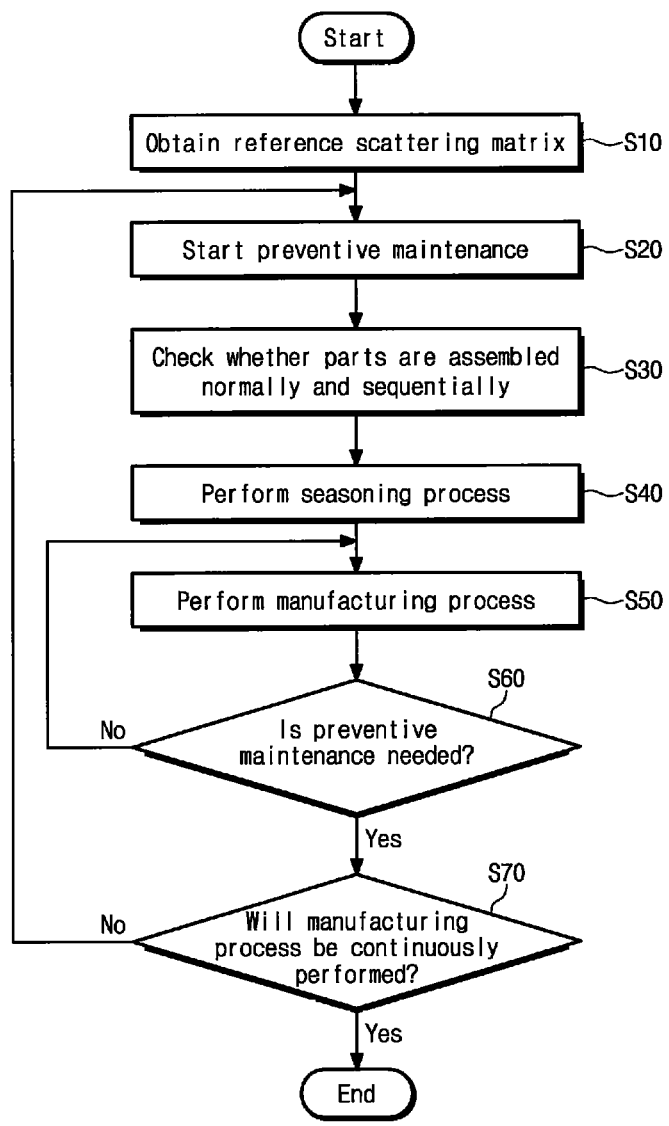
FIG. 4 is a flow chart illustrating a management method of semiconductor manufacturing equipment according to first embodiments of the inventive concept.

FIG. 4 is a flow chart illustrating a management method of a semiconductor manufacturing equipment 70 according to first embodiments of the inventive concept.

Referring to FIGS. 1 and 4, each of the control units 90 may obtain a reference scattering matrix from each of the parts 40 of the chamber 10 (in S10). The reference scattering matrix may include first to fourth reference scattering variables. The first to fourth reference scattering variables may correspond to first and second reference reflectances and first and second reference absorptivities, which may be measured by the high-frequency voltage meter 80.

Next, the control unit 90 may instruct an operator to start a PM step for the semiconductor manufacturing equipment 70 (in S20). The PM step may be periodically performed, based on a cumulative operating time of the semiconductor manufacturing equipment 70. Alternatively, the PM step may be performed, when the semiconductor manufacturing equipment 70 is abnormally operated. Information on necessity of the PM step may be provided to the operator via a display or alarm device (not shown) of the control unit 90. In the PM step, the parts 40 may be disassembled and be cleaned through a wet cleaning process. Consumable or damaged ones of the parts 40 may be replaced with a new one.

Thereafter, to check whether the parts 40 are normally assembled during the PM step, the control unit 90 may monitor the parts 40 in a predetermined sequence (in S30). Whenever the parts 40 are individually assembled, the control unit 90 may check whether the parts 40 are assembled normally.

Figure 5:
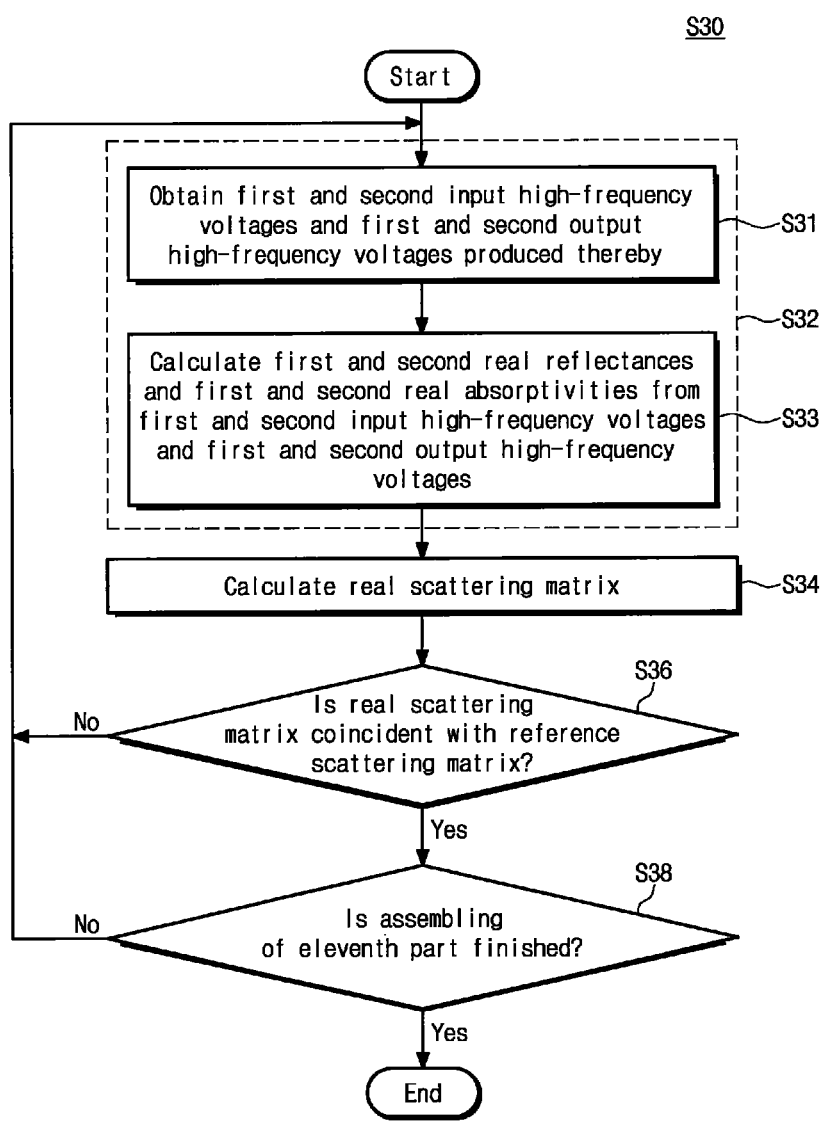
FIG. 5 is a flow chart illustrating a step, for example, shown in FIG. 4, for checking whether the parts are assembled correctly.

FIG. 5 is a flow chart illustrating the step S30 of FIG. 4 for checking whether the parts 40 are normally assembled. The step S30 may include obtaining first and second real reflectances and first and second real absorptivities from the parts 40 (in S32), calculating a real scattering matrix (in S34), comparing the reference scattering matrix with the real scattering matrix (in S36), and checking whether all the parts 40 are assembled (in S38).

The step S32 of obtaining the first and second real reflectances and the first and second real absorptivities from the parts 40 may include a step S31 of obtaining a first output high-frequency voltage $V_{out1}$ and a second output high-frequency voltage $V_{out2}$, which are produced in response to a first input high-frequency voltage $V_{in1}$ and a second input high-frequency voltage $V_{in2}$, which are applied to the parts 40. Frequencies of the first and second input high-frequency voltages $V_{in1}$ and $V_{in2}$ may be changed. The high-frequency voltage meter 80 may measure the first and second output high-frequency voltages $V_{out1}$ and $V_{out2}$.

The step S32 of obtaining the first and second real reflectances and the first and second real absorptivities from the parts 40 may further include a step S33 of calculating first and second real reflectances and first and second real absorptivities from the first and second output high-frequency voltages and the first and second input high-frequency voltages.

The real scattering matrix may be calculated from the first and second real reflectances and the first and second real absorptivities (in S34). The real scattering matrix may include first to fourth scattering variables corresponding to the first and second real reflectances and the first and second real absorptivities.

The step S36 of comparing the reference scattering matrix with the real scattering matrix may be a step for checking whether the parts 40 are normally assembled. For example, in the case where the reference scattering matrix is not similar to the real scattering matrix, the control unit 90 may interpret the parts 40 as being abnormally assembled. In this case, the parts 40 may be disassembled and then re-assembled.

Figure 6:
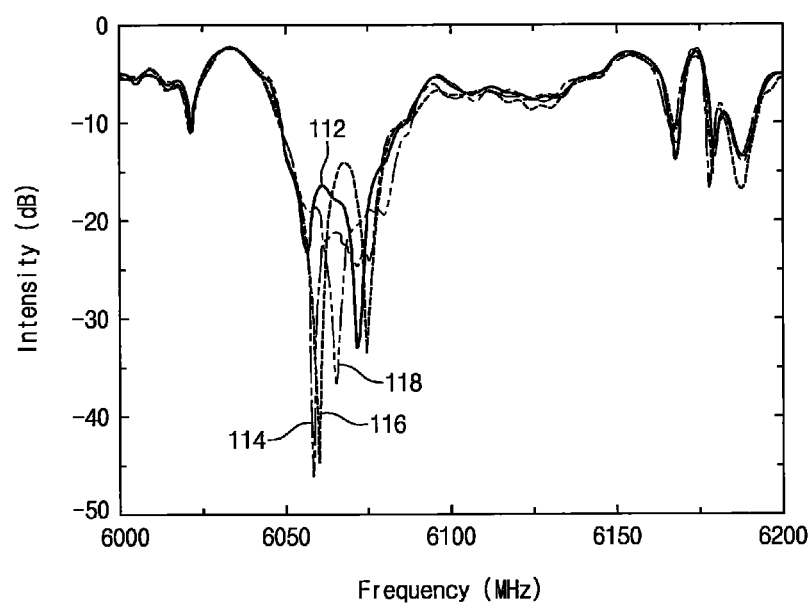
FIG. 6 is a graph showing first reference reflectance and first real reflectances over a frequency of a high-frequency voltage.

FIG. 6 is a graph showing first reference reflectance and first real reflectances over a frequency of a high-frequency voltage. In the case where the parts 40 are abnormally assembled, first real reflectances 114-118 may be different from a first reference reflectance 112. For example, when the high-frequency voltage ranges from about 6,050 MHz to about 6,080 MHz, there were a difference in positions of peaks of the first real reflectances 114-118 and the first reference reflectance 112.

Whenever a position of a misassembled part is changed, such a difference between the first real reflectances 114-118 and the first reference reflectance 112 may be found. For example, the first reference reflectance 112 had a peak at a frequency of about 6072 MHz. When the second part 22 was incorrectly assembled, the first real reflectance 114 had a peak at a frequency of about 6058 MHz. When the fifth part 25 was removed, the first real reflectance 116 had a peak at a frequency of about 6060 MHz. When the sixth part 26 was removed, the first real reflectance 118 had a peak at a frequency of about 6065 MHz. In other words, in the case that the parts 40 are assembled incorrectly, a difference in resonance frequency between the first real reflectances 114-118 and the first reference reflectance 112 may be greater than or equivalent to about 7 MHz.

Referring back to FIG. 5, in the case where the reference scattering matrix is equal or similar to the real scattering matrix, the control unit 90 may interpret the parts 40 as being assembled correctly. In example embodiments, the first reference reflectance of the reference scattering matrix may be compared with the first real reflectance of the real scattering matrix.

FIGS. 7 through 17 are graphs showing first reference reflectance and first real reflectance, which were respectively measured from first to eleventh parts 21-34, over the frequency of the high-frequency voltage.

Figure 7:
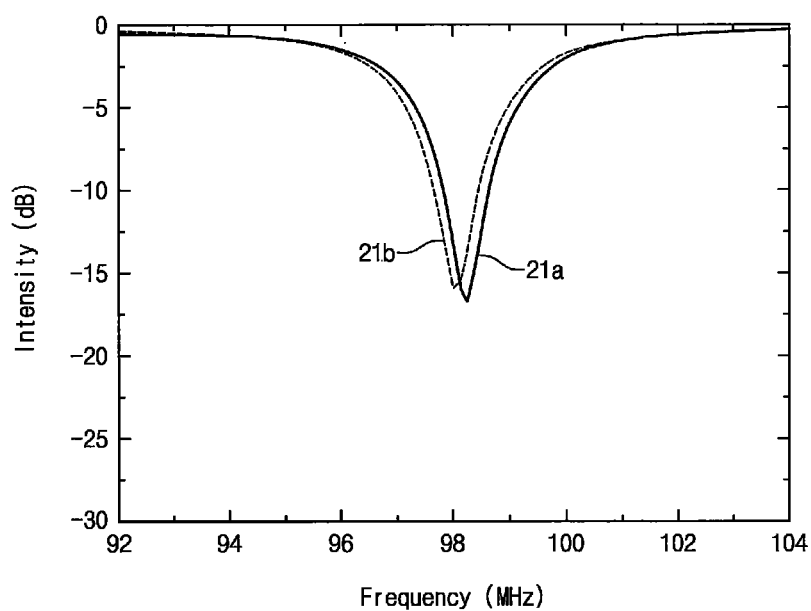
FIGS. 7 through 17 are graphs showing first reference reflectance and first real reflectance, which were respectively measured from first to eleventh parts, over the frequency of the high-frequency voltage.

Referring to FIG. 7, when the first part 21 was normally assembled, a first real reflectance 21b of the first part 21 had a resonance frequency of about 98 MHz and a resonance intensity of about −16 dB. The resonance intensity may be a logarithm value of a voltage ratio. A first reference reflectance 21a of the first part 21 had a resonance frequency of about 98.2 MHz and a resonance intensity of −17 dB. In the case where the first part 21 was normally assembled, a difference in resonance frequency between the first real reflectance 21b and the first reference reflectance 21a of the first part 21 was less than a tolerance limit of about 0.2 MHz.

Figure 8:
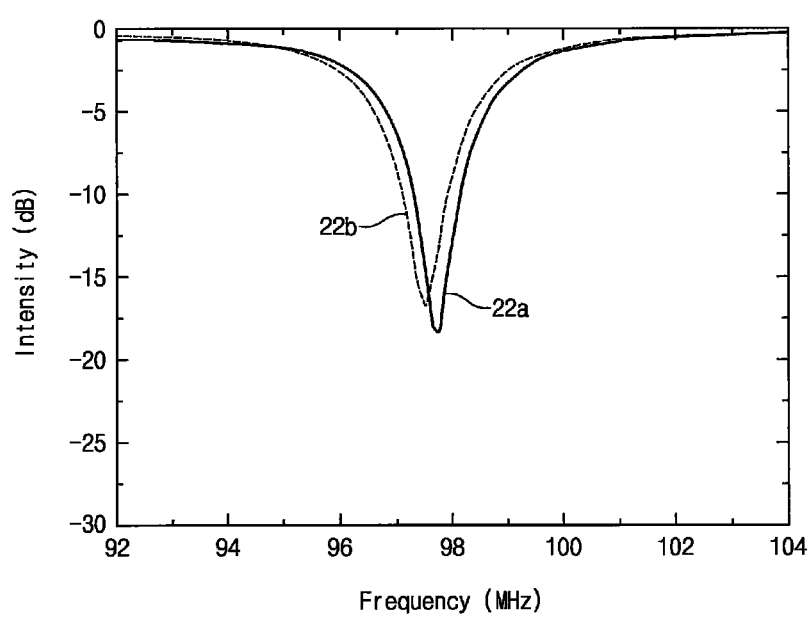

Referring to FIG. 8, when the second part 22 was normally assembled, a first real reflectance 22b of the second part 22 had a resonance frequency of about 97.4 MHz and a resonance intensity of about −17 dB. A first reference reflectance 22a of the second part 22 had a resonance frequency of about 97.7 MHz and a resonance intensity of about −18 dB. In the case where the second part 22 was normally assembled, a difference in resonance frequency between the first real reflectance 22b and the first reference reflectance 22a of the second part 22 was less than about 0.3 MHz.

Figure 9:
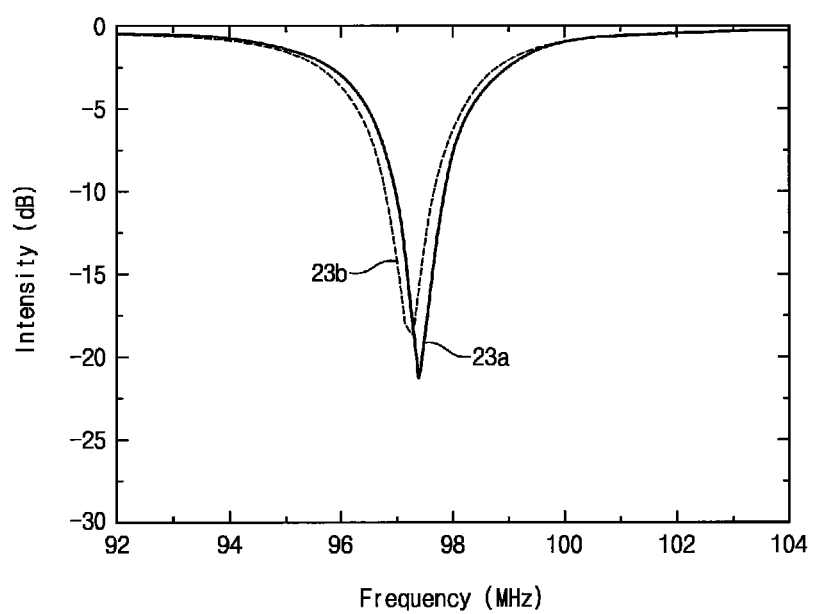

Referring to FIG. 9, when the third part 23 was normally assembled, a first real reflectance 23b of the third part 23 had a resonance frequency of about 97.2 MHz and a resonance intensity of about −18 dB. A first reference reflectance 23a of the third part 23 had a resonance frequency of about 97.4 MHz and a resonance intensity of about −22 dB. In the case where the third part 23 was normally assembled, a difference in resonance frequency between the first real reflectance 23b and the first reference reflectance 23a of the third part 23 was less than about 0.2 MHz.

Figure 10:
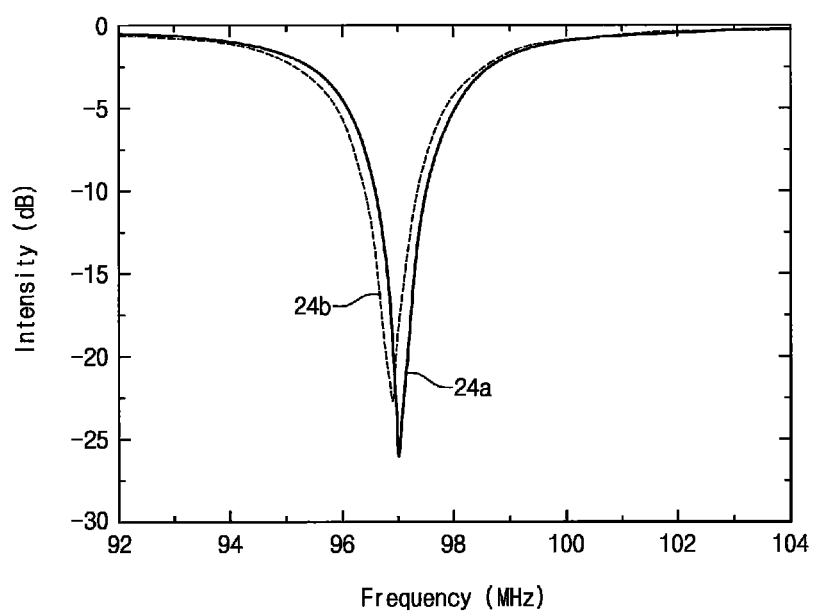

Referring to FIG. 10, when the fourth part 24 was normally assembled, a first real reflectance 24b of the fourth part 24 had a resonance frequency of about 96.9 MHz and a resonance intensity of about −22.5 dB. A first reference reflectance 24a of the fourth part 24 had a resonance frequency of about 97 MHz and a resonance intensity of about −26 dB. In the case where the fourth part 24 was normally assembled, a difference in resonance frequency between the first real reflectance 24b and the first reference reflectance 24a of the fourth part 24 was less than about 0.1 MHz.

Figure 11:
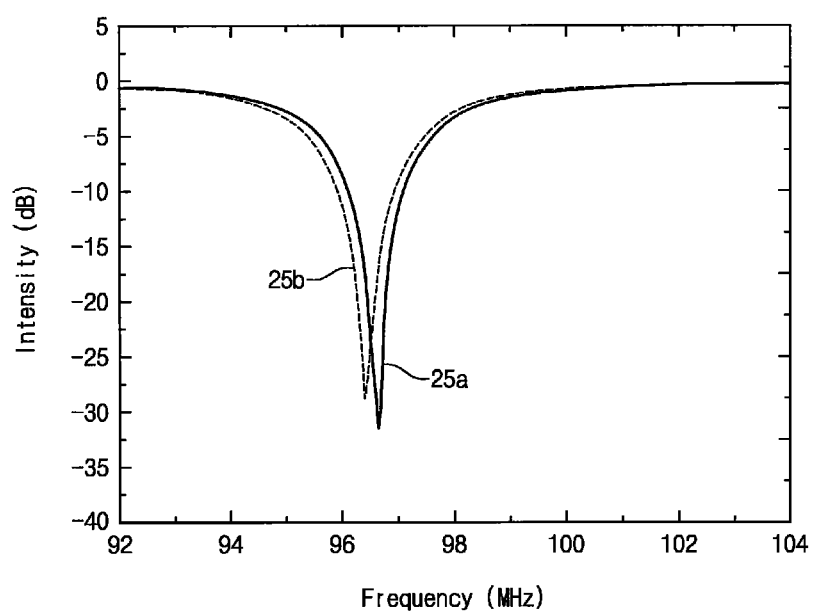

Referring to FIG. 11, when the fifth part 25 was normally assembled, a first real reflectance 25b of the fifth part 25 had a resonance frequency of about 96.4 MHz and a resonance intensity of about −28 dB. A first reference reflectance 25a of the fifth part 25 had a resonance frequency of about 96.6 MHz and a resonance intensity of about −32 dB. In the case where the fifth part 25 was normally assembled, a difference in resonance frequency between the first real reflectance 25b and the first reference reflectance 25a of the fifth part 25 was less than about 0.2 MHz.

Figure 12:
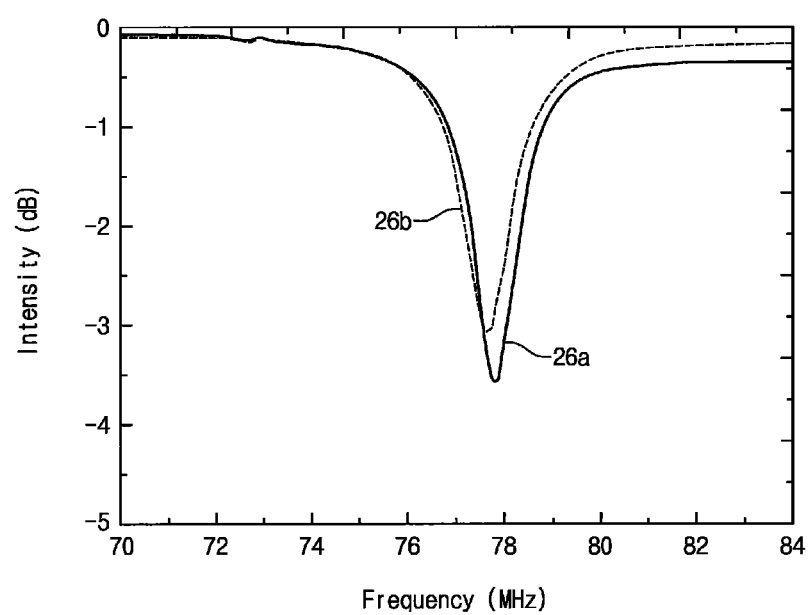

Referring to FIG. 12, when the sixth part 26 was normally assembled, a first real reflectance 26b of the sixth part 26 had a resonance frequency of about 77.7 MHz and a resonance intensity of about −3 dB. A first reference reflectance 26a of the sixth part 26 had a resonance frequency of about 77.9 MHz and a resonance intensity of about −3.6 dB. In the case where the sixth part 26 was normally assembled, a difference in resonance frequency between the first real reflectance 26b and the first reference reflectance 26a of the sixth part 26 was less than about 0.2 MHz.

Figure 13:
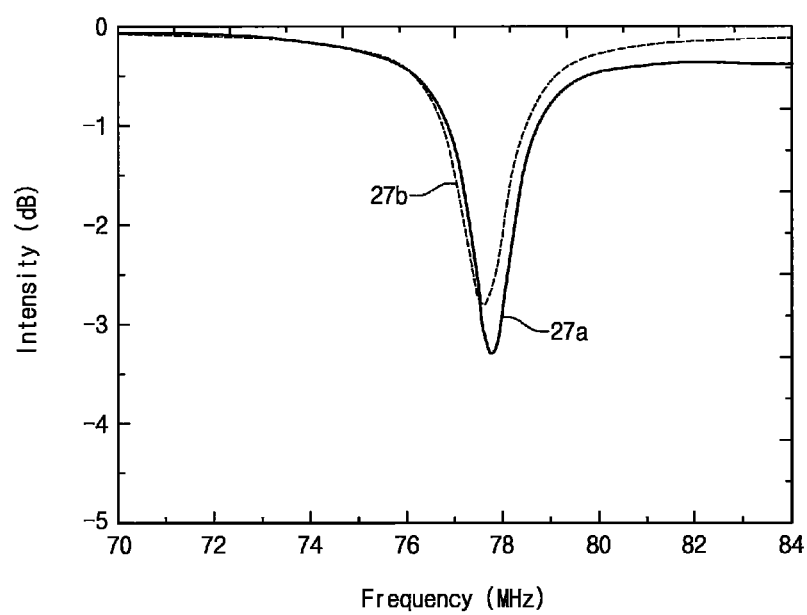

Referring to FIG. 13, when the seventh part 27 was normally assembled, a first real reflectance 27b of the seventh part 27 had a resonance frequency of about 77.6 MHz and a resonance intensity of about −2.8 dB. A first reference reflectance 27a of the seventh part 27 had a resonance frequency of about 77.8 MHz and a resonance intensity of about −3.3 dB. In the case where the seventh part 27 was normally assembled, a difference in resonance frequency between the first real reflectance 27b and the first reference reflectance 27a of the seventh part 27 was less than about 0.2 MHz.

Figure 14:
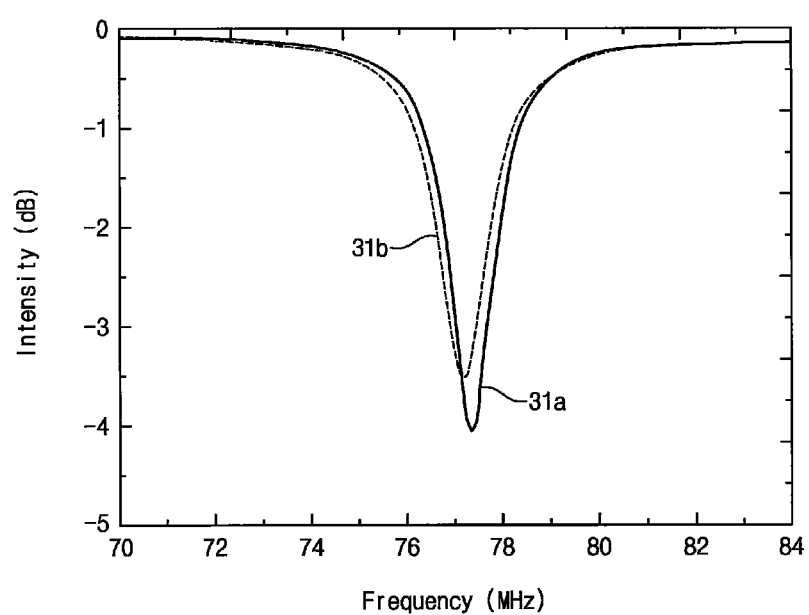

Referring to FIG. 14, when the eighth part 31 was normally assembled, a first real reflectance 31b of the eighth part 31 had a resonance frequency of about 77.2 MHz and a resonance intensity of about −3.5 dB. A first reference reflectance 31a of the eighth part 31 had a resonance frequency of about 77.4 MHz and a resonance intensity of about 4 dB. In the case where the eighth part 31 was normally assembled, a difference in resonance frequency between the first real reflectance 31b and the first reference reflectance 31a of the eighth part 31 was less than about 0.2 MHz.

Figure 15:
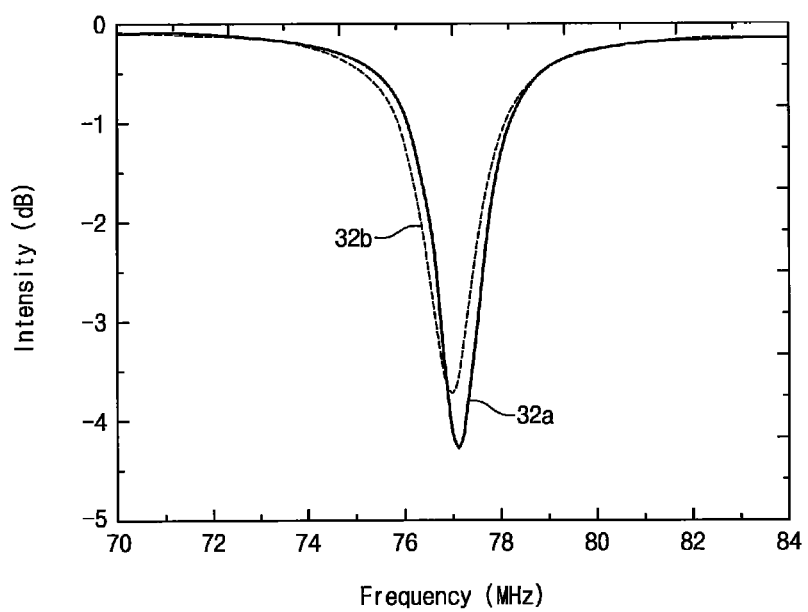

Referring to FIG. 15, when the ninth part 32 was normally assembled, a first real reflectance 32b of the ninth part 32 had a resonance frequency of about 77 MHz and a resonance intensity of about −3.75 dB. A first reference reflectance 32a of the ninth part 32 had a resonance frequency of about 77.1 MHz and a resonance intensity of about −4.3 dB. In the case where the ninth part 32 was normally assembled, a difference in resonance frequency between the first real reflectance 32b and the first reference reflectance 32a of the ninth part 32 was less than about 0.1 MHz.

Figure 16:
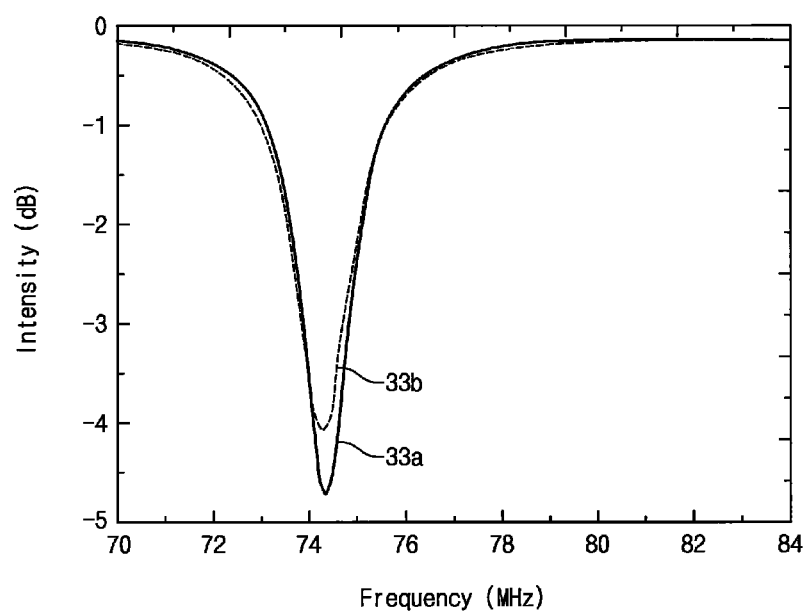

Referring to FIG. 16, when the tenth part 33 was normally assembled, a first real reflectance 33b of the tenth part 33 had a resonance frequency of about 74.2 MHz and a resonance intensity of about −4 dB. A first reference reflectance 33a of the tenth part 33 had a resonance frequency of about 74.4 MHz and a resonance intensity of about −4.7 dB. In the case where the tenth part 33 was normally assembled, a difference in resonance frequency between the first real reflectance 33b and the first reference reflectance 33a of the tenth part 33 was less than about 0.2 MHz.

Figure 17:
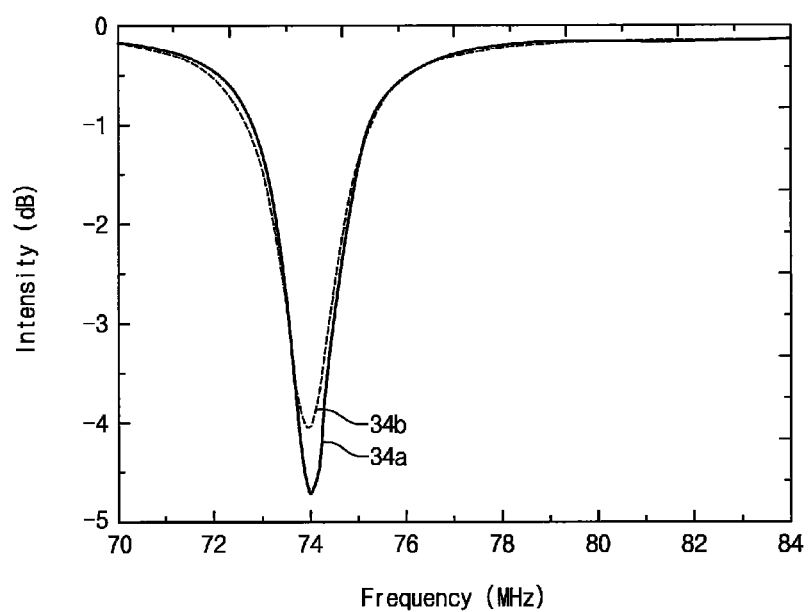

Referring to FIG. 17, when the eleventh part 34 was normally assembled, a first real reflectance 34b of the eleventh part 34 had a resonance frequency of about 74 MHz and a resonance intensity of about −4.1 dB. A first reference reflectance 34a of the eleventh part 34 had a resonance frequency of about 74 MHz and a resonance intensity of about −4.7 dB. The first real reflectance 34b and the reference reflectance 34a of the eleventh part 34 had substantially the same resonance frequency.

Figure 18:
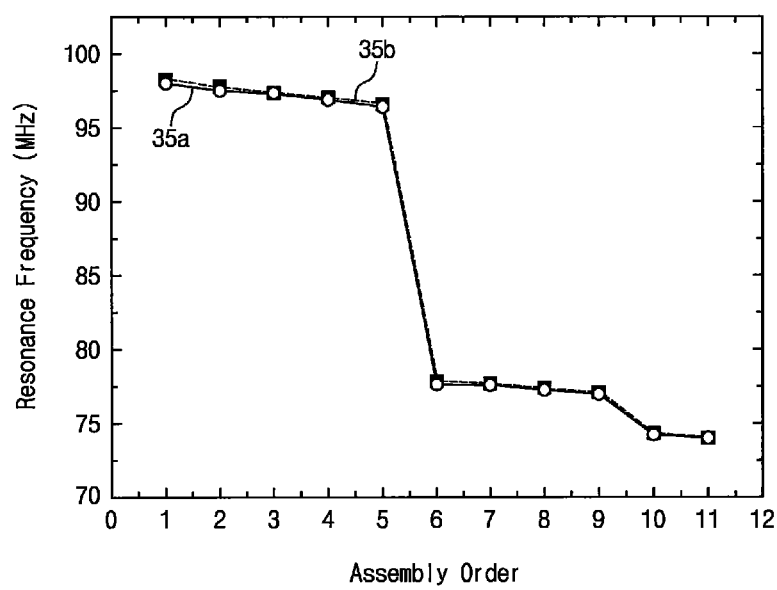
FIG. 18 is a graph showing a change in resonance frequency of the high-frequency voltage, according to an assembling order of the first to eleventh parts.

FIG. 18 is a graph showing a change in resonance frequency of the high-frequency voltage, according to an assembling order of the first to eleventh parts 21-34. When the first to eleventh parts 21-34 were normally assembled, a resonance frequency 35a of the first reference reflectance almost corresponded with resonance frequencies 35b of the first real reflectances within a tolerance limit of about 0.2 MHz. The tolerance limit may be affected by types, cumulative operating times, manufacturers of the semiconductor manufacturing equipment 70 and/or the parts 40 or standards therefor.

In example embodiments, the resonance frequency 35a of the first reference reflectance and the resonance frequencies 35b of the first real reflectances may be sequentially decreased. The resonance frequency 35a of the first reference reflectance and the resonance frequencies 35b of the first real reflectances may be increased in inverse proportion to inductances and capacitances of the first to eleventh parts 21-34. The inductance and/or capacitance may be increased, as the number of assembled parts increases. When the sixth part 26 was assembled, the resonance frequency may be abruptly decreased. This may be because the sixth part 26 causes an abrupt increase in capacitance.

Figure 19:
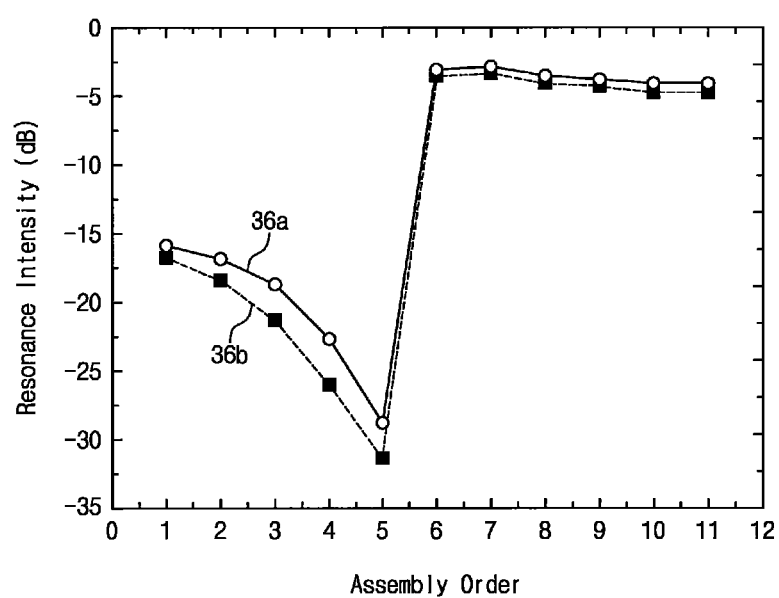
FIG. 19 is a graph showing a change in resonance intensity of the high-frequency voltage, according to an assembling order of the first to eleventh parts.

FIG. 19 is a graph showing a change in resonance intensity of the high-frequency voltage, according to an assembling order of the first to eleventh parts 21-34. Resonance intensities 36a of the first reference reflectances of the first to eleventh parts 21-34 may be similar to a resonance intensity 36b of the first real reflectance. Alternatively, the resonance intensities 36a of the first reference reflectances of the first to fifth parts 21-25 may be somewhat different from the resonance intensity 36b of the first real reflectance. In the case where a difference between the resonance intensity 36a of the first reference reflectance and the resonance intensity 36b of the first real reflectance increases, the first to fifth parts 21-25 may be abnormally assembled.

Meanwhile, in the control unit 90, the resonance frequencies and intensities of the first real and reference reflectances may be represented in terms of a vector and be compared with each other. Such a vector representation may allow the control unit 90 to process and store data quantitatively.

Figure 20:
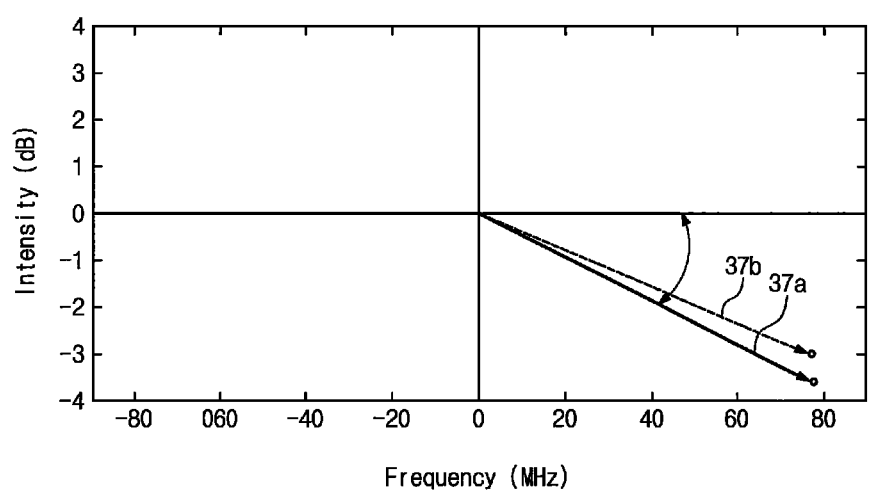
FIG. 20 is a graph showing vectors, whose coordinates are given by resonance frequencies and resonance intensities of the first reference and real reflectances of FIG. 12.

FIG. 20 is a graph showing reference and real vectors 37a and 37b, whose coordinates are given by resonance frequencies and intensities of the first reference and real reflectances 26a and 26b of FIG. 12. The control unit 90 may be configured to compare the reference vector 37a with the real vector 37b and determine whether the sixth part 26 is correctly assembled. The reference vector 37a may correspond to the resonance frequency and intensity of the first reference reflectance 26a of the sixth part 26. The real vector 37b may correspond to the resonance frequency and intensity of the first real reflectance 26b of the sixth part 26. Since coordinates of the reference vector 37a and the real vector 37b represent resonance frequencies and intensities, it is possible to improve efficiency in data processing and storing operations of the control unit 90.

Referring back to FIG. 5, the control unit 90 may perform the step of checking whether all the parts 40 are assembled (in S38). The control units 90 may perform repeatedly the steps S32-S38, until all the parts 40 are assembled. If all the parts 40 are normally assembled, the PM step may be stopped. After the PM step, a plasma reaction may be induced in the chamber 10. According to example embodiments of the inventive concept, by using the afore-described management method, it is possible to check in real time without plasma reaction whether the parts 40 are normally assembled, when the PM step is performed.

Referring to FIG. 4, if the PM step is normally finished, a seasoning process may be performed on at least one of the chambers 10 (in S40). The seasoning process may include depositing a polymer layer (not shown) on an inner surface and the parts 40 of the chamber 10 using a plasma reaction. During the seasoning process, a bare wafer may be loaded in the chamber 10. The seasoning process may be performed in several to several tens of hours.

Next, a manufacturing process may be performed in the semiconductor manufacturing equipment 70 (in S50). The manufacturing process may include a run-time step and an idle-time step. During the run-time step, a plasma process may be performed in the chamber 10. In certain embodiments, the run-time step may be performed during about 10 minutes to about 1 hour. During the idle-time step, the chamber 10 may be in a stand-by state. In certain embodiments, during the idle-time step, a wafer may be loaded in or unloaded from the chamber 10. Further, during the idle-time step, a pumping process may be performed to exhaust the air from the chamber 10. During the idle-time step, the plasma reaction may not be induced in the chamber 10. In certain embodiments, the idle-time step may be performed during about 20 minutes to about 40 minutes.

Next, the control unit 90 may decide whether the PM step should be performed (in S60). The PM step may be performed when a cumulative operating time of the semiconductor manufacturing equipment 70 is beyond a predetermined value. Alternatively, the PM step may be performed, when the semiconductor manufacturing equipment 70 is abnormally operated.

The control unit 90 may decide whether the manufacturing process should be continuously preformed or not (in S70). If performance of the PM step is determined, the manufacturing process may have to stop periodically or permanently. When the manufacturing process may be periodically stopped, the control unit 90 may instruct an operator to start the PM step for the semiconductor manufacturing equipment 70 (in S20). When the manufacturing process may be permanently stopped, the production of the semiconductor device is finished.

Second Embodiments

Figure 21:
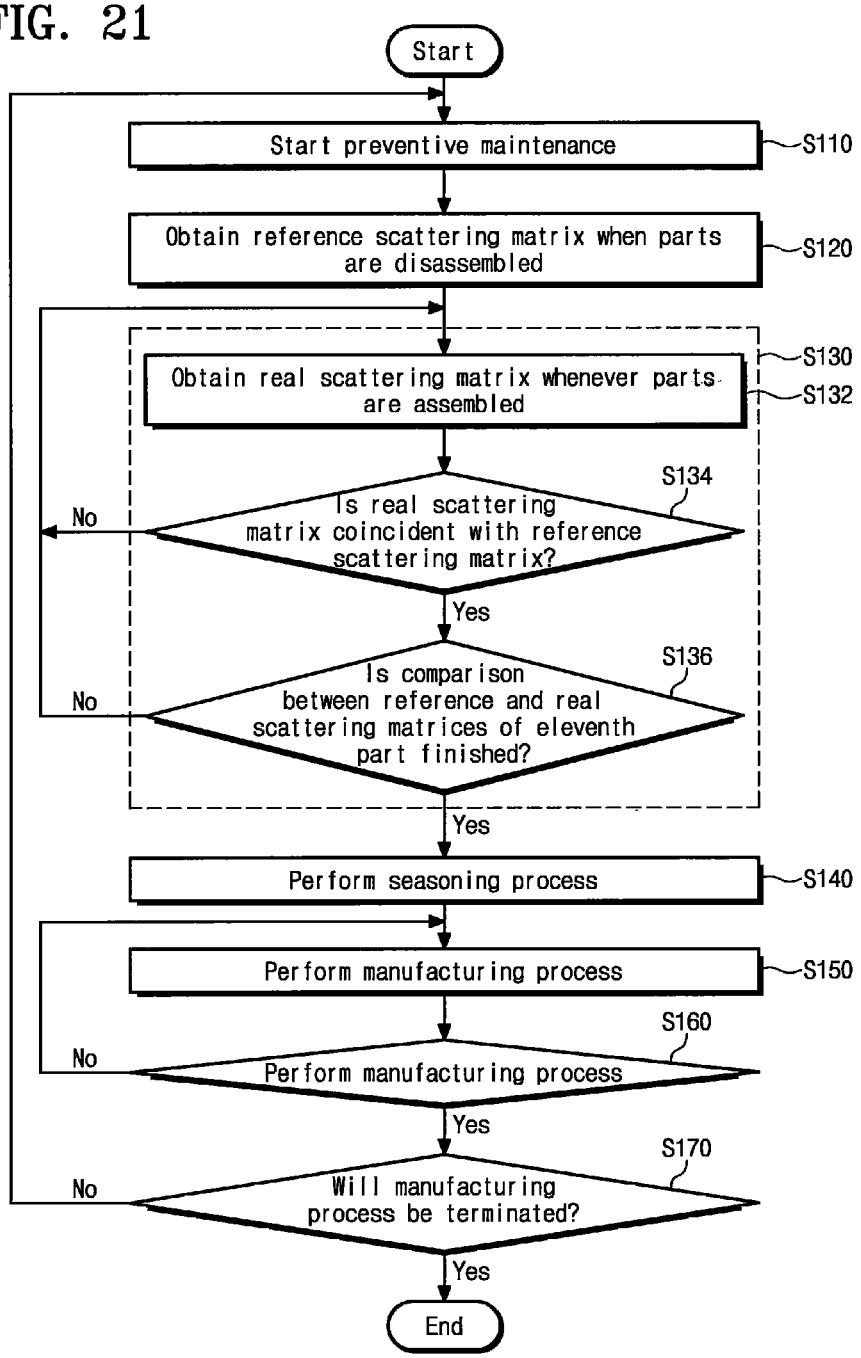
FIG. 21 is a flow chart illustrating a management method of semiconductor manufacturing equipment according to second embodiments of the inventive concept.

FIG. 21 is a flow chart illustrating a management method of a semiconductor manufacturing equipment according to second embodiments of the inventive concept. The control unit 90 may instruct an operator to start a PM step for the parts 40 (in S110). If a cumulative operation time of the parts 40 is beyond a predetermined value, the PM step may be periodically performed. During the PM step, the parts 40 may be disassembled and cleaned using a wet cleaning process or may be replaced with new parts.

Whenever the parts 40 are disassembled in the PM step, a reference scattering matrix may be obtained (in S120). For example, in the control unit 90, first and second reference reflectances and first and second reference absorptivities may be calculated from first and second input high-frequency voltages, which are applied to the parts 40 to be disassembled, and first and second output high-frequency voltages, which are measured in response to the first and second input high-frequency voltages. The reference scattering matrix may include first to fourth reference scattering variables, which correspond to the first and second reference reflectances and the first and second reference absorptivities.

After the cleaning or replacement of the parts 40, the parts 40 may be assembled during the PM step. Here, the control unit 90 may check whether the parts 40 are normally assembled (in S130). In example embodiments, the step S130 may include a step S132 of obtaining a real scattering matrix, a step S134 of comparing the real scattering matrix with the reference scattering matrix, and a step S136 of comparing and checking reference and real scattering matrices of the eleventh part 34.

The step S132 may include obtaining first and second real reflectances and first and second real absorptivities. The first and second real reflectances and the first and second real absorptivities may be obtained using the high-frequency voltage meter 80 and the control unit 90, whenever the parts 40 are assembled. The real scattering matrix may include the first and second real reflectances and the first and second real absorptivities.

The step S134 may be performed to check whether the parts 40 are normally assembled. For example, if the reference and real scattering matrices are coincident with each other, the parts 40 may be determined to be normally assembled. In certain embodiments, a predetermined tolerance limit may be used to determine whether the reference and real scattering matrices are coincident with each other. If the reference and real scattering matrices are not coincident with each other, the parts 40 may be determined to be abnormally assembled, and the step S132 may be again performed on the parts 40.

The step S136 may be performed to check whether the assembling process of the parts 40 is finished. The control unit 90 may perform repeatedly the steps S132-S136, until all the parts 40 are assembled.

If the assembling process of the parts 40 is finished, a seasoning process may be performed on the chamber 10 (in S140). The seasoning process may include performing a manufacturing process on a bare wafer (not shown) loaded in the chamber 10 using the same or similar process condition of the manufacturing process. For example, the seasoning process may be performed for about several tens of minutes to several tens of hours.

Thereafter, a manufacturing process may be performed (in S150). The manufacturing process may be, for example, an etching process or a deposition process.

Next, the control unit 90 may determine whether the PM step will be performed on the chamber 10, in consideration of a cumulative operating time of the parts 40 or the number of processed lots (in S160). For example, the PM step may be started when the cumulative operating time reaches several thousands to several tens of thousands of hours and/or the number of processed lots reaches several hundreds to several thousands. If the PM step is not needed, the manufacturing process may be performed (in S150).

The control unit 90 may decide whether the manufacturing process should be terminated or not (in S170). If the manufacturing process should not be terminated, the control unit 90 may instruct an operator to start the PM step for the parts 40.

According to example embodiments of the inventive concept, provided are methods and systems for managing semiconductor manufacturing equipment. By using reflectance and absorptivity of a high-frequency voltage, it is possible to monitor in real time whether parts of a chamber are normally assembled in a preventive maintenance.

While example embodiments of the inventive concepts have been particularly shown and described, it will be understood by one of ordinary skill in the art that variations in form and detail may be made therein without departing from the spirit and scope of the attached claims.

What is claimed is:

1. A method of managing semiconductor manufacturing equipment including a controller, the method comprising:
   instructing a preventive maintenance by the controller on the semiconductor manufacturing equipment, the preventive maintenance comprising disassembling, cleaning, and reassembling a plurality of parts associated with a chamber;
checking whether the plurality of parts are correctly assembled, using reflectance and absorptivity of a high-frequency voltage applied to the plurality of parts by the controller; and
inducing a plasma reaction in the chamber by the controller using a high-frequency power generated by a generator, the high-frequency power different from the high-frequency voltage,
wherein checking whether the plurality of parts are correctly assembled comprises:
applying first and second input high-frequency voltages of the high-frequency voltage via a high-frequency voltage meter connected in series to the plurality of parts; and
obtaining first and second output high-frequency voltages responded to the first and second input high-frequency voltages from the plurality of parts.

2. The method of claim 1, further comprising, prior to instructing preventive maintenance, obtaining a reference reflectance and a reference absorptivity of the plurality of parts by the controller,
wherein the checking further comprises:
obtaining a real reflectance and a real absorptivity from the high-frequency voltage applied to the plurality of parts; and
comparing the real reflectance and the real absorptivity with the reference reflectance and the reference absorptivity, respectively, to check whether the assembling of the plurality of parts is correctly performed.

3. The method of claim 2, wherein obtaining the real reflectance and the real absorptivity comprises:
calculating the real reflectance and the real absorptivity from the first and second output high-frequency voltages and the first and second input high-frequency voltages.

4. The method of claim 3, wherein each of the real reflectance and the reference reflectance has a resonance frequency and a resonance intensity obtained from the first and second input high-frequency voltages and the first and second output high-frequency voltages, and
wherein the resonance frequency decreases as the reassembling of the plurality of parts progresses.

5. The method of claim 4, wherein, in response to determining that the resonance frequency of the reference reflectance is coincident with that of the real reflectance, the reassembling of the plurality of parts is determined to be correctly performed.

6. The method of claim 4, wherein, in response to determining that the resonance frequency of the reference reflectance is different from that of the real reflectance, the reassembling of the plurality of parts is determined to be incorrectly performed, and
wherein the resonance frequency and the resonance intensity are calculated using a vector.

7. The method of claim 4, wherein total inductance and capacitance of the parts increase as the reassembling of the plurality of parts progresses.

8. The method of claim 2, wherein the reference reflectance and the reference absorptivity correspond to reference scattering variables obtained from the plurality of parts, and
wherein the method further comprises calculating a reference scattering matrix including the reference scattering variables.

9. The method of claim 8, wherein the real reflectance and the real absorptivity correspond to real scattering variables, and
wherein the checking further comprises calculating a real scattering matrix including the real reflectance and the real absorptivity.

10. The method of claim 9, wherein the comparing the real reflectance and the real absorptivity with the reference reflectance and the reference absorptivity comprises comparing the real scattering matrix with the reference scattering matrix.

11. The method of claim 1, wherein the disassembling of the plurality of parts comprises obtaining a reference scattering matrix, and
wherein the checking comprises:
obtaining a real scattering matrix whenever the reassembling of the plurality of parts is performed; and
comparing the real scattering matrix with the reference scattering matrix to check whether the plurality of parts are correctly reassembled.

12. The method of claim 1, further comprising:
performing a seasoning process on the chamber; and
performing a manufacturing process including a run step and an idle step,
wherein the run step comprises generating plasma in the chamber and wherein the idle step is performed without generating plasma in the chamber.

13. A system for managing semiconductor manufacturing equipment, in which a chamber, including a plurality of parts, is provided, the system comprising:
a generator generating a high-frequency power to induce plasma reaction in the chamber;
a high-frequency voltage meter connected in series to the plurality of parts and configured to apply an input high-frequency voltage to the plurality of parts and measure an output high-frequency voltage from the plurality of parts, the input high-frequency voltage different form the high-frequency power; and
a control unit configured to obtain reflectance and absorptivity from the input and output high-frequency voltages and to determine whether the plurality of parts are correctly assembled using the reflectance and the absorptivity.

14. The system of claim 13, wherein the plurality of parts comprise:
a lower part provided at a lower portion of the chamber; and
an upper part provided at an upper portion of the chamber to face the lower part,
wherein the high-frequency voltage meter comprises:
a first lead connected to the lower part; and
a second lead connected to the upper part.

15. The system of claim 14, further comprising:
matching circuitry configured to achieve impedance matching between the generator and the upper part,
wherein the upper part comprises internal and outer electrodes connected to the generator,
the lower part comprises an electrostatic chuck which is connected to a ground voltage,
the first lead is connected to the electrostatic chuck, and
the second lead is connected to at least one of the internal and outer electrodes.

* * * * *